United States Patent [19]
Matsuoka

[11] Patent Number: 5,154,619
[45] Date of Patent: Oct. 13, 1992

[54] IC SOCKET

[75] Inventor: Noriyuki Matsuoka, Yokohama, Japan

[73] Assignee: Yamaichi Electric Co., Ltd., Tokyo, Japan

[21] Appl. No.: 773,115

[22] Filed: Oct. 8, 1991

[30] Foreign Application Priority Data

Oct. 12, 1990 [JP] Japan .................................. 2-274422

[51] Int. Cl.⁵ .............................................. H01R 9/09
[52] U.S. Cl. ......................................... 439/72; 439/68; 439/70; 439/330
[58] Field of Search ................... 439/68, 70, 72, 79, 439/80, 330, 525, 526

[56] References Cited

U.S. PATENT DOCUMENTS

| 4,541,676 | 9/1985 | Hansen et al. | 439/68 |
| 4,715,823 | 12/1987 | Ezura et al. | 439/70 |
| 4,750,890 | 6/1988 | Dube et al. | 439/70 |
| 4,824,389 | 4/1989 | Doyle et al. | 439/72 |
| 4,846,703 | 7/1989 | Matsuoka et al. | 439/330 |
| 4,931,020 | 6/1990 | Matsuoka et al. | 439/330 |

Primary Examiner—Paula A. Bradley
Attorney, Agent, or Firm—Wenderoth, Lind & Ponack

[57] ABSTRACT

An IC socket has an IC supporting platform upwardly resiliently held on a socket body for vertical movement and adapted to contact with contacts held by the socket body, and an anchoring member for anchoring the IC supporting platform to the socket body against the resiliently holding force. The anchoring member is loosely engaged with the supporting platform at a central portion of the IC supporting platform. The IC supporting platform is playably anchored at the loosely engaging portion.

3 Claims, 6 Drawing Sheets

F I G. 1
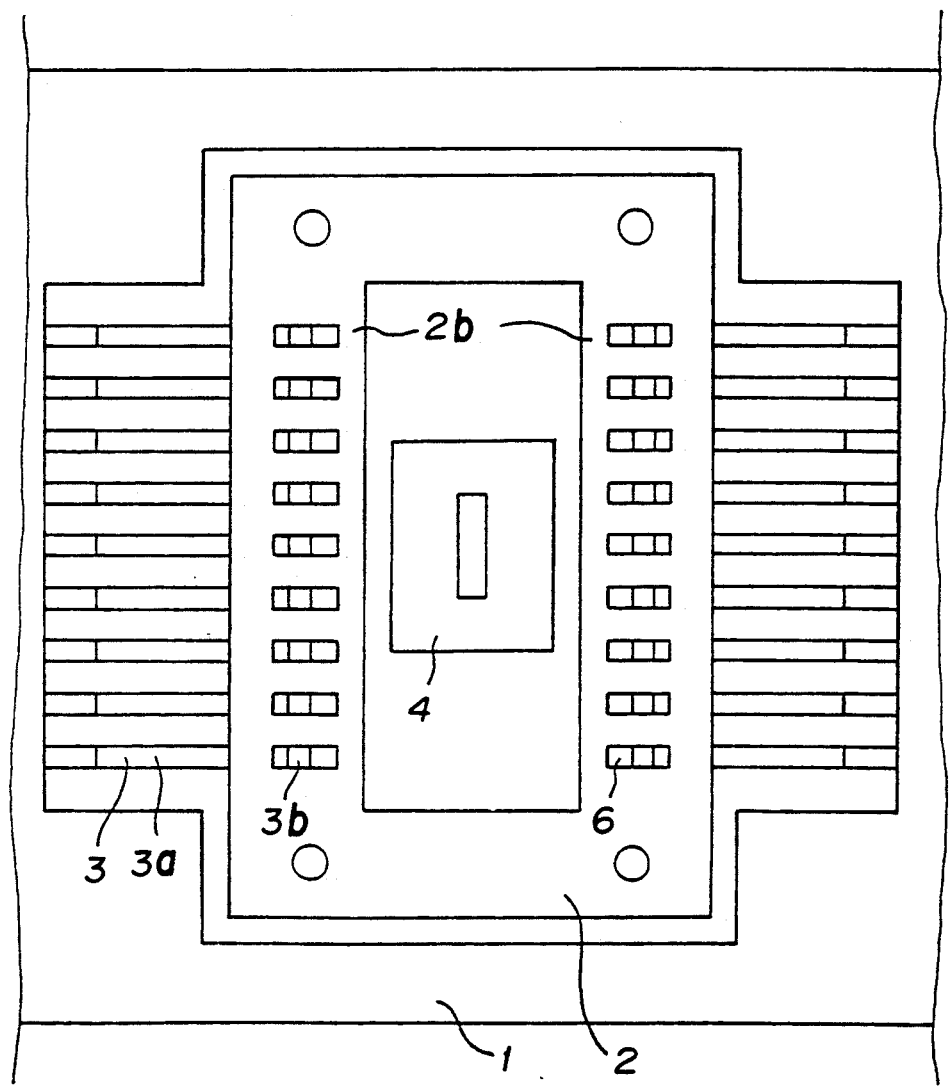

IC SOCKET

BACKGROUND OF THE INVENTION

1. Field of the Invention

This invention relates to an IC socket for supporting an IC on its supporting platform so that the IC is readily contacted with contacts.

2. Brief Description of the Prior Art

FIGS. 8 through 10 show a conventional IC socket including an IC supporting platform.

An IC supporting platform 2' has leg portions 3' extending downward in parallel relation. The leg portions 3' are inserted into a guide hole 4' formed in a socket body 1' and at the same time, outwardly facing retaining claws 3a' each formed on a lower end of each of the leg portions 3' is retained in the wall of the guide hole 4' in order to prevent the IC supporting platform 2' from escaping upwardly. Furthermore, the leg portions 3' also serve to allow vertical and horizontal movements of the supporting platform against a spring 5' in association with the spring 5' urging the supporting platform 2' upwardly while holding the supporting platform 2' in its uppermost position. The supporting platform 2' and the leg portions 3' are comprised of a unitary number of component parts integrally formed of a synthetic resin material. When an IC is placed on the supporting platform 2' and pushed down by a cover (not shown) mounted on the socket body 1', or by a robot, the supporting platform 2' is moved in the horizontal direction while being lowered integrally together with the leg portions 3' against the spring 5'.

On the other hand, contact portions 7' of contacts 6' are in engagement with positioning holes 8' formed in a marginal portion of the supporting platform 2' and orderly arranged in a row. When the supporting platform 2' is moved in the horizontal direction integrally together with the leg portions 3' in order to be brought into correspondence with the IC, the contact portions 7' are also displaced following the movement of the supporting platform 2'. As a result, a correct correspondence between each contact portion 7' and each IC lead can be obtained.

However, in the above-mentioned conventional IC socket, if a gap formed between the guide hole 4' formed in the socket body 1' and each of the leg portions 3' is small as shown in FIG. 8, the range of horizontal movement of the supporting platform 2' is extremely limited. On the contrary, if the gap between the guide hole 4' and each of the leg portions 3' is designed to be large in order to obtain a large amount of movement of the supporting platform 9' as shown in FIG. 9, the retaining claw 3' of the leg portion 3' will tend to escape from the guide hole 4' as shown in FIG. 10 when the supporting platform 2' is moved in the horizontal direction. If the retaining claw 3a' is designed to be large in order to prevent the afore-mentioned undesirable incident, the spring stroke of the leg portion 3' is required to be set long in view of the necessity of pushing the leg portion 3' into the guide hole 4' to cause it to be retained at the wall of the guide hole 4'. This results in an increased bulk of the socket as a whole.

Furthermore, an additional problem with this prior art IC socket is that the horizontal movement of the supporting platform with the IC placed thereon lacks smoothness and reliability due to elastic resistance of the leg portions and retaining resistance of the retaining claws, and as a result, proper contact between the IC leads and the contacts arranged at micro pitches becomes difficult to obtain.

SUMMARY OF THE INVENTION

It is therefore an object of the present invention to provide, in order to obviate the above inconveniences, an IC socket in which a supporting platform can, smoothly and reliably, be horizontally moved into a position correctly corresponding to an IC mounted thereon, without increasing the bulk of the IC socket.

Another object of the invention is to provide an IC socket in which an IC is stably supported both on a lead supporting platform and on an IC body supporting platform, so that deformation of the IC leads can effectively be prevented, and both vertical and horizontal movements can surely be effected without increasing the bulk of the IC socket.

As means for obviating the above inconveniences, the present invention is constructed as follows. An IC supporting platform is resiliently held on a socket body for vertical movement. An anchoring member for anchoring the IC supporting platform to the socket body against the resilient force is loosely engaged with the supporting platform. In other words, the anchoring member is loosely engaged with the supporting platform so that the supporting platform is playably anchored at the portion which is loosely engaged therewith.

According to another aspect of the present invention, the IC socket is constructed as follows. A socket body includes a vertically movable first supporting platform for supporting IC leads, and a second supporting platform for supporting an IC body at a central portion of the first supporting platform. Leg portions extending downward from the second supporting platform are implanted in the socket body for the purpose of anchoring the first supporting platform. The leg portions of the second supporting platform are loosely inserted into a central opening formed in the first supporting platform in order to playably anchor the first supporting platform.

Moreover, the second supporting platform is also resiliently held on the socket body for vertical movement and anchored thereto in such a manner as to be able to move in the horizontal direction as in the first supporting platform.

According to the present invention, when the IC is placed on the supporting platform and pushed down, the supporting platform is lowered while being moved in the horizontal direction against the resilient contacting force at the engaging portion between the supporting platform and the anchoring member. As a result, a relative position between the IC and the supporting platform, and relative positions between the IC leads and the contacts are properly attained. A horizontal movement of the supporting platform can be secured at the engaging portion between the supporting platform and the anchoring member. The anchoring member may be formed in a length long enough for anchoring the supporting platform. As a result, the above-mentioned effects can be obtained without increasing the bulk of the socket.

Furthermore, according to the present invention, when the IC is placed on the socket and pushed down, the IC leads are supported on the first supporting platform and the IC body is supported on the second supporting platform. As a result, the IC can stably be supported to provide proper contact. In addition, deformation of the IC leads can be prevented when the IC is placed on the socket and brought into contact under pressure. As in the above-mentioned case, a sufficient amount of horizontal movement of the first supporting platform is secured at the loosely inserted portion between the leg portion of the second supporting platform and the first supporting platform. Accordingly, it is not necessary to form the leg portion long in order to increase the amount of horizontal movement. As a result, the socket is not made bulkier.

Moreover, since the second supporting platform is resiliently moved only following the resilient movement of the first supporting platform, the IC can be more reliably supported and properly contacted.

BRIEF DESCRIPTION OF THE DRAWINGS

FIG. 1 is a plan view of an IC socket according to the first embodiment of the present invention;

DETAILED DESCRIPTION OF THE EMBODIMENTS

Figure 2:
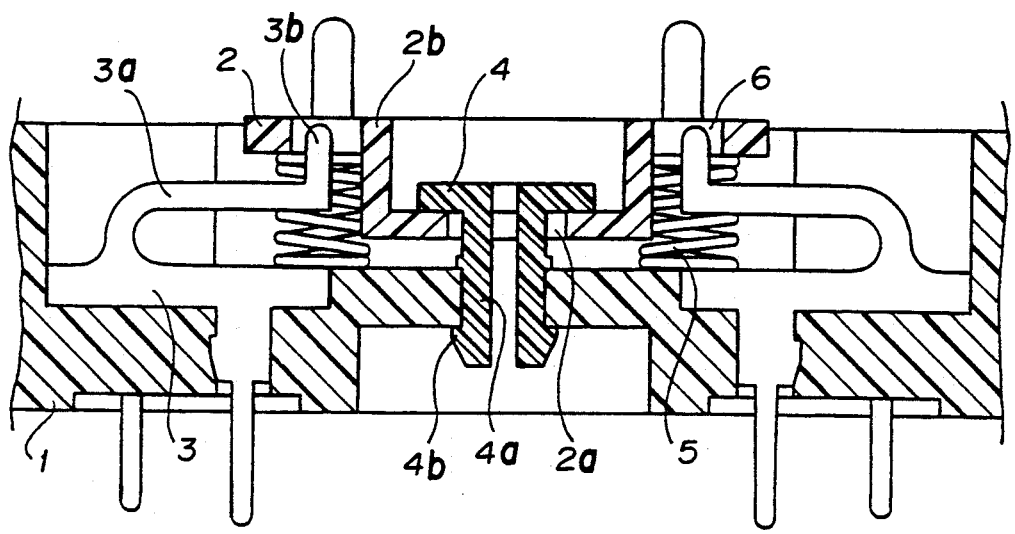
FIG. 2 is a sectional view of the IC socket of FIG. 1.

While describing the embodiments of the present invention with reference to FIGS. 1 through 7, the first embodiment will be described in detail with reference to FIGS. 2 and 4.

The numeral 1 denotes a socket body formed of a generally rectangular insulated base member. The socket body 1 includes a first supporting platform 2 vertically movably disposed on a central portion of its upper surface. A plurality of contacts are arranged in parallel relation along four sides or two sides of the outer periphery of the first supporting platform 2. The first supporting platform 2 has a second supporting platform 4 disposed at its central portion.

The second supporting platform 4 has resilient leg portions 4a extending downward in parallel relation. Each of the leg portions 4a has an engaging claw 4b formed on its free end in such a manner as to be vertically spaced apart and adapted to engage with the socket body 1 in order to prevent the second supporting platform 4 from escaping. The socket body 1 is provided with an opening 1a formed in a central portion immediately under the first supporting platform 2. The retaining claw 4b facing outward is inserted into the central opening 1a against the elasticity of the leg portion 4a and engaged with a peripheral edge of the opening 1a by the restoring force of the retaining claw 4b. A spring 5 is disposed between, for example, the first supporting platform 2 and the socket body 1 in order to resiliently support and urge the first supporting platform upwardly. As a result, the first supporting platform 2 is lowered against the spring 5 and raised in accordance with the spring 5. Also, by virtue of the foregoing arrangement, a horizontal movement and an inclining movement as will be described hereinafter are obtainable. That is, the first supporting platform 2 is provided with a central opening 2a formed in a central portion thereof and permitting the leg portion 4a of the second supporting platform 4 to be loosely inserted therein. Upon insertion of the retaining claw 4b of the second supporting platform 4 through the central opening 2a and engagement thereof, with the peripheral wall of the central opening 1a of the socket body 1, the second supporting platform 4 is anchored by the socket body 1. As a result, the first supporting platform 2 is held in its uppermost position against the spring 5 and is able to effect the above-mentioned vertical and horizontal movements and an inclining movement. The first supporting platform 2 is provided with IC positioning portions 2b projecting from the area around the central opening 2a.

The second supporting platform 4 and the leg portion 4a form an anchor member for anchoring the first supporting platform 2 against the resiliency of the spring 5. Thus, the second supporting platform 4 is retained on the first supporting platform 2 and acts as a retaining means for preventing the first supporting platform 2 from moving upward. In the anchor member, the leg portion 4a is loosely fitted into the central opening 2a of the first supporting platform 2 for permitting the first supporting platform from moving horizontally. The anchoring member is mounted on the socket body 1 by the leg portions 4a a manner as to be movable in the vertical direction (upward and downward) or otherwise, is fixedly implanted therein without being resiliently held by the spring, as shown in FIGS. 2 through 4, so that the anchoring member is incapable of movement in the vertical direction. A plurality of positioning holes 6 are arranged in parallel relation in marginal portions of four sides or two sides of the outer peripheral portion of the first supporting platform 2 at contact pitches, and therefore, at pitches equal to those of the IC leads 7a. The holes 6 are adapted to receive contact portions 3b at distal ends of the corresponding contacts 3 in order to correctly position the contacts 3.

The contacts 3 are implanted in the socket body portion at the outer peripheral portion of the first supporting platform 2. Each of the contacts 3 has an elastic contact element 3a extending toward the first supporting platform 2 from the implanted portion, and the contact portion 3b of the elastic contact element 3a is inserted into the corresponding positioning hole 6 as mentioned. The elastic contact element 3a restricts the sideward displacement of the contact portion 3b in the positioning hole 6, to thereby establishing a relative position between the first supporting platform 2 and the contact 3. When the first supporting platform 2 is horizontally moved either forwardly and backwardly or rightwardly and leftwardly, the elastic contact element 3a of the contact 3 is also displaced in order to maintain its position relative to the first supporting platform 2.

In this way, the first supporting platform 2 can be moved forwardly and backwardly, rightwardly and leftwardly, and upwardly and downwardly, and is engaged with the second supporting platform 4 to restrict its upward movement and define its raised position.

The second supporting platform 4 is resiliently supported and urged upwardly on the socket body 1 by a spring 8 interposed therebetween. The second supporting platform 4 is lowered against the spring 8 and raised in accordance with the spring 8. It is held in its uppermost position against the spring 8.

Figure 3:
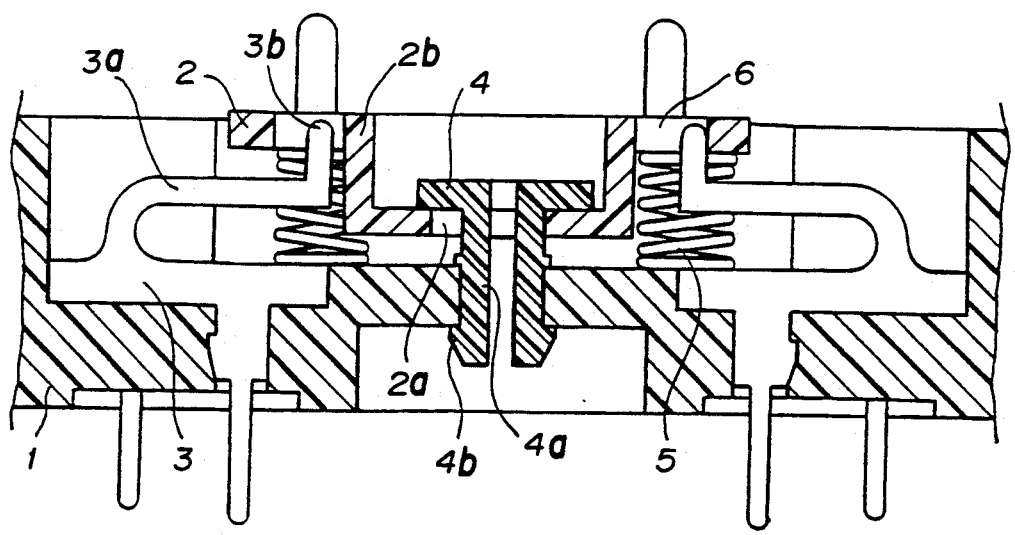
FIG. 3 is likewise a sectional view of the IC socket of FIG. 1 but showing a state where a supporting platform is moved in a horizontal direction.
Figure 4:
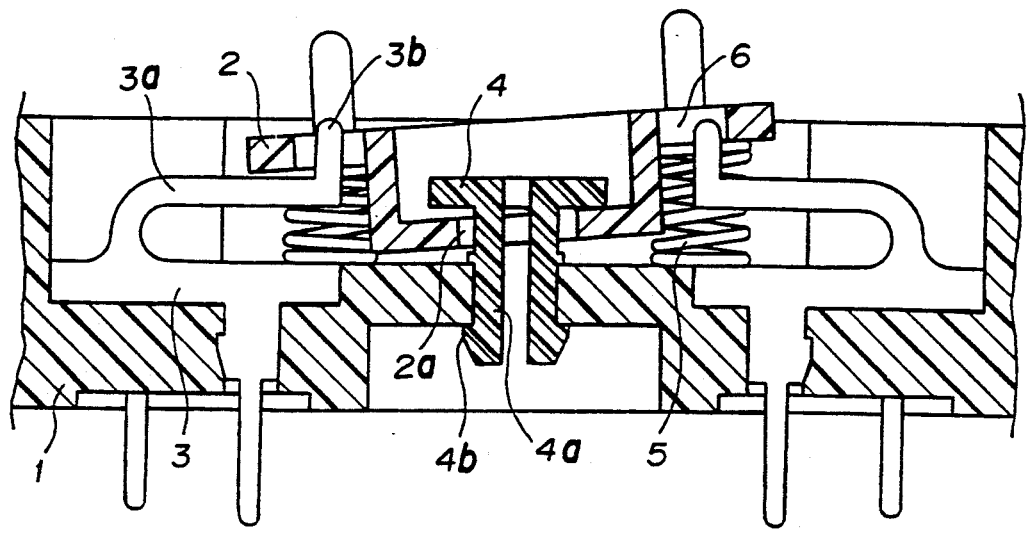
FIG. 4 is also a sectional view of the IC of FIG. 1, but showing an inclined state of the supporting platform.
Figure 5:
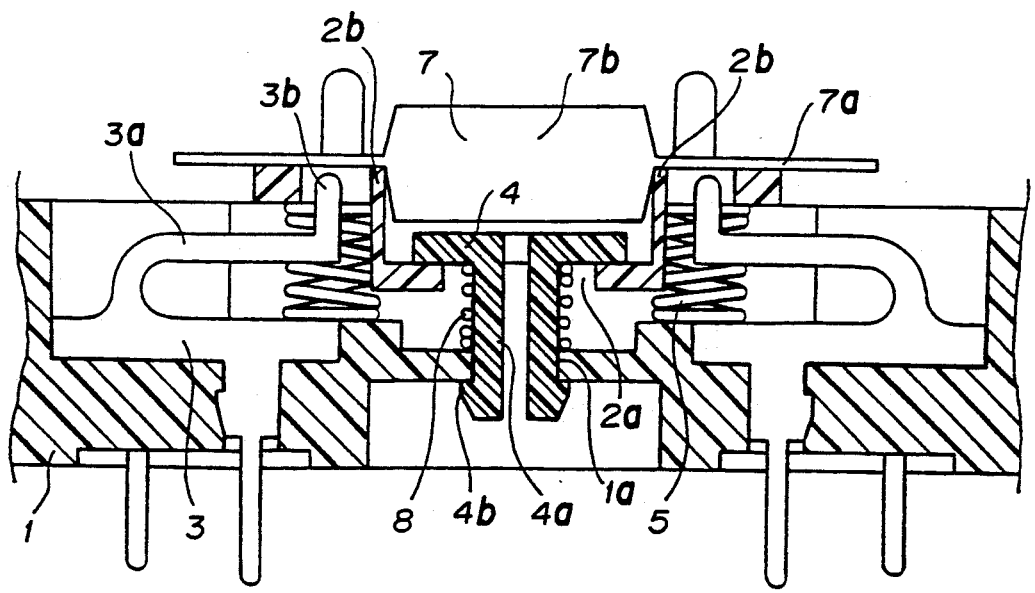
FIG. 5 is a sectional view of an IC socket according to the second embodiment of the present invention, showing IC leads supported on a first supporting platform.
Figure 6:
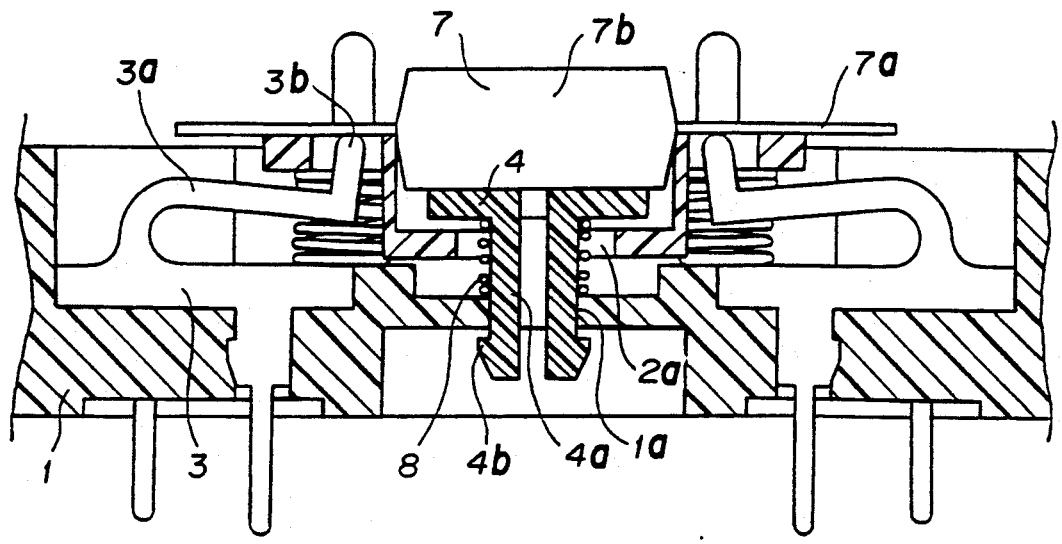
FIG. 6 is likewise a sectional view of the IC socket of FIG. 5, showing an IC body placed on a second supporting platform.
Figure 7:
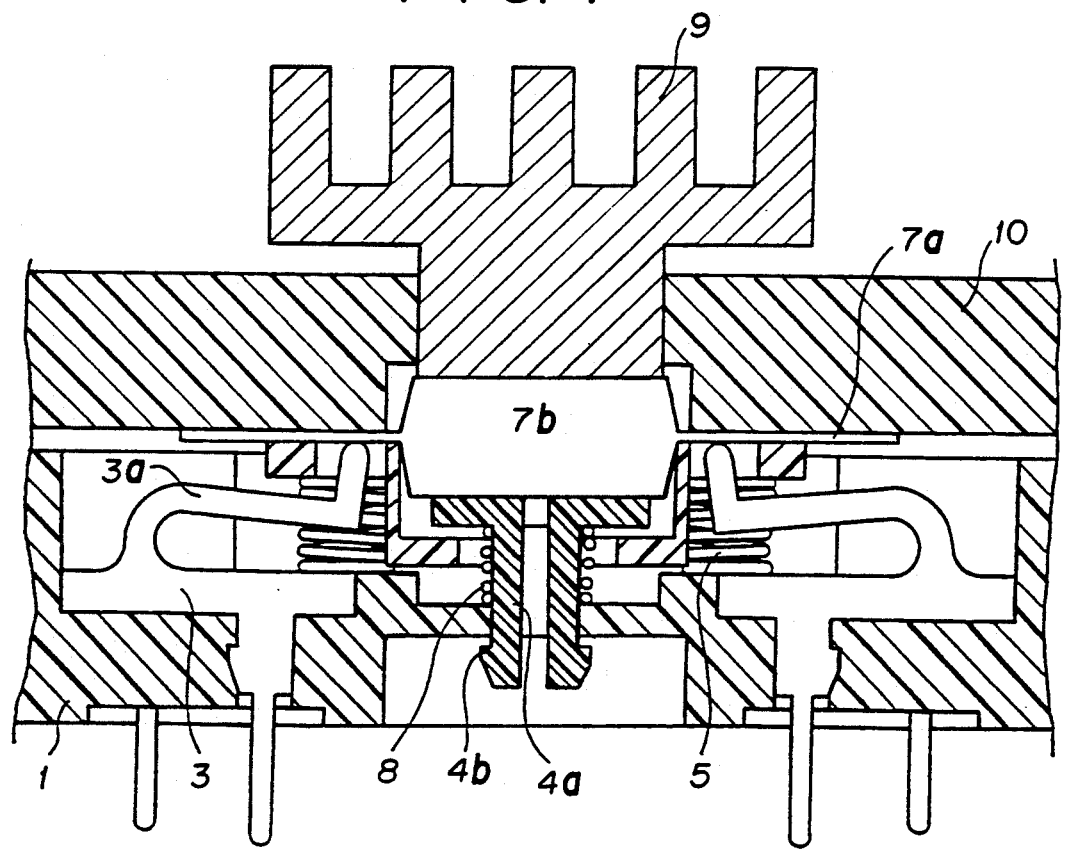
FIG. 7 is also a sectional view of the IC socket of FIG. 6, but showing the IC pressed against a radiating plate by the second supporting platform.
Figure 8:
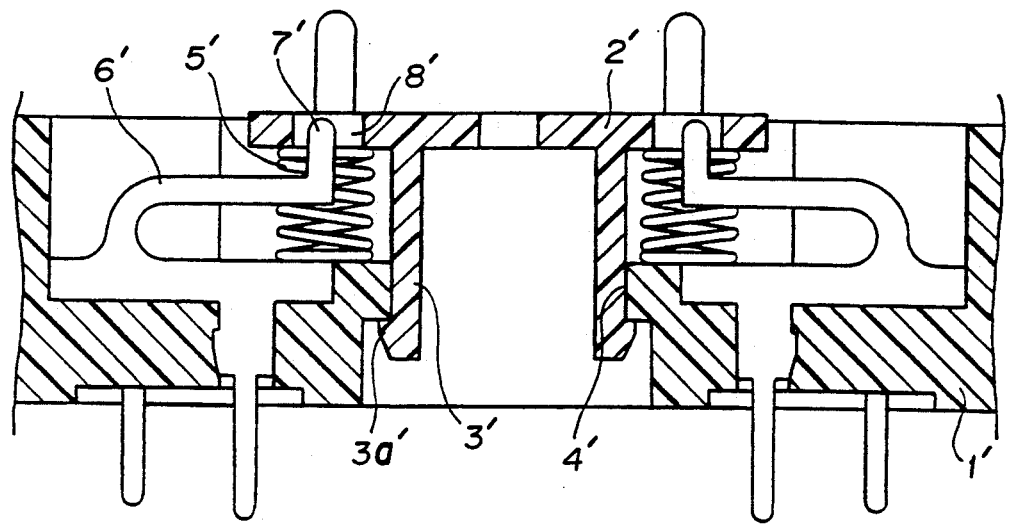
FIG. 8 is a sectional view of a conventional IC socket.
Figure 9:
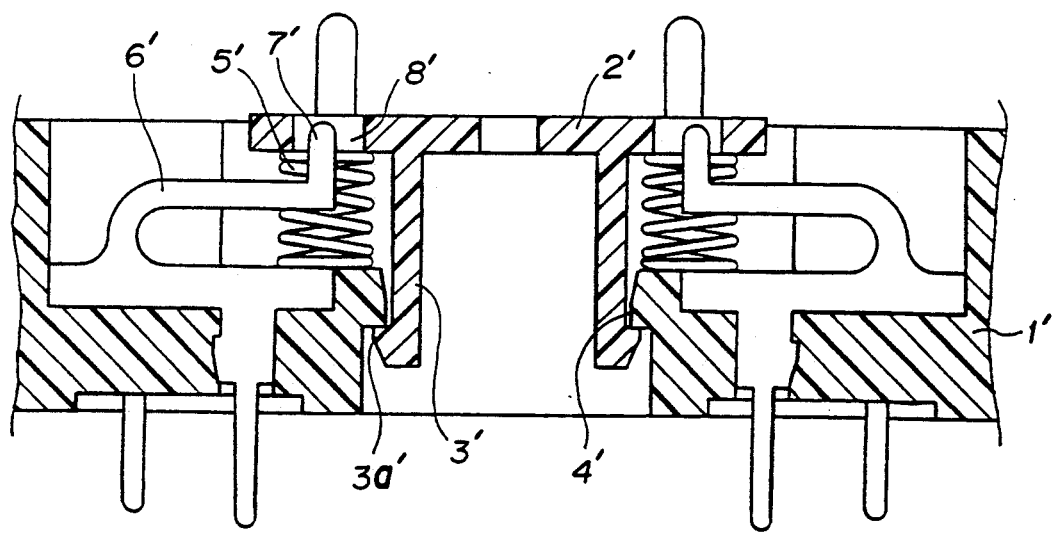
FIGS. 9 and 10 are likewise sectional views of a conventional IC socket similar to that of FIG. 8, but showing a comparatively large space formed between a guide hole and each leg portion.
Figure 10:
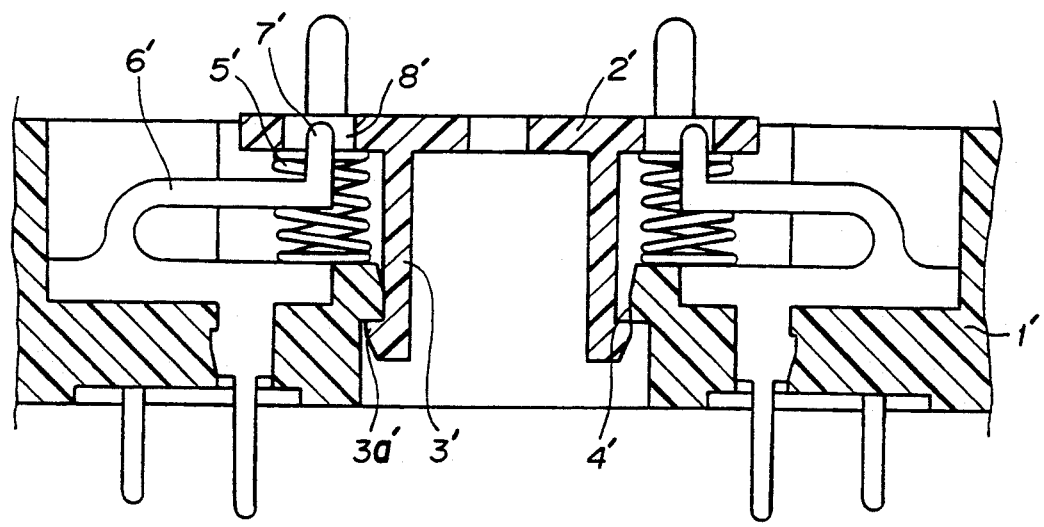

The embodiment shown in FIGS. 2 through 4 includes a second supporting platform 4, which also acts as a retaining means, in the embodiment shown in FIGS. 5 through 7. Otherwise, it may include a retaining portion merely forming an anchoring member and expanding like the shape of a flange at an upper end of the leg portion 4a. The flange-like upper end of the retaining portion is retained at an upper peripheral edge of the central opening 2a to anchor the first supporting platform 2. The second supporting platform 4 (retaining portion) is not resiliently held by a spring and the leg portion 4a is fixedly implanted in the socket body 1 so that it is incapable of moving upward and downward as mentioned above. When a flat type IC 7 is placed on the first supporting platform 2, the first supporting platform 2 is moved at the loosely engaged portion between the 2a central opening 2a and the leg portion 4a in association with the movement of the flat type IC 7, and the elastic element 3a of each contact is also displaced following the movement thereof. As a result, relative positions between the IC leads 7a and the contact portions 3b of the contacts are maintained. Thus, the first supporting platform 2 is operated to correctly position the side edge of the IC body 7b through its IC positioning portion 2b, and to support the IC lead 7a on an upper surface of the positioning portion. At the same time, the IC body 7b is supported by the second supporting platform 4 so that the former is brought into contact with the contact portion 3b of the contact 3. It may be designed such that the IC is not originally placed on the supporting platform but is held in a state floating over the supporting platform. In that state, the IC lead 7a is placed on the contact portion 3b of the contact 3. When pushed down, the IC is supported on the first supporting platform, and the IC body is likewise supported on the second supporting platform 2.

As is shown in FIG. 7, when a presser plate 10 including a radiating plate 9 is disposed on the base member of the socket, the lead 7a of the IC 7 or the IC body 7b is pressed together with the first supporting platform 2 so that it is moved downward against the spring 5. As a reaction, the contact portion 3b of the contact 3 is brought into abutment with the IC lead 7a and bent in that state in order to obtain a contact pressure by its restoring force. Further, irrespective of the lower position of the first supporting platform 2, the second supporting platform 4 urges the IC 7 against the radiating plate 9 to secure a reliable contact between the IC 7 and the radiating plate 9. As a result, favorable radiating effects can be obtained.

According to the present invention, the relative position between the IC and supporting platform and the relative positions between the IC leads and contacts can be made to correctly correspond with each other by smoothly and reliably moving the supporting platform in the horizontal direction at the loosely engaging portion between the supporting platform and the anchoring member. As a result, a highly reliable contact relation can be obtained.

Furthermore, a stable contact relation can be obtained by supporting the IC both by the supporting platform for supporting the IC leads and by another supporting platform for supporting the IC body. Also, deformation of IC leads can effectively be prevented when they are brought into contact.

Moreover, according to the present invention, it is no longer necessary to make the elastic stroke of the leg portions as in the past in order to obtain a proper amount of horizontal movement of the first supporting platform. As a result, an initially intended object can be achieved without increasing the bulk of the IC socket.

What is claimed is:

1. An IC socket comprising an IC supporting platform upwardly resiliently held on a socket body for vertical movement and adapted to contact with contacts held by said socket body, and an anchoring member for anchoring said IC supporting platform to said socket body against the resiliently holding force, said anchoring member having an engaging portion loosely engaged with said IC supporting platform at a central portion of said IC supporting platform in order to playably anchor said IC supporting platform to said socket body.

2. An IC socket comprising a first supporting platform vertically movably mounted on a socket body and adapted to engage with contacts held by said socket body, a spring upwardly resiliently urging said first supporting platform, a second supporting platform disposed at a central portion of said first supporting platform and adapted to support an IC body, and leg portions extending downward from said second supporting platform and being implanted in said socket body, said leg portions being loosely inserted into a central opening formed in said first supporting platform, said second supporting platform being brought into engagement with said first supporting platform in order to playably anchor said first supporting platform to said socket body against the bias of said spring.

3. An IC socket as claimed in claim 2, wherein said second supporting platform is vertically movably mounted on said socket body by said leg portions and upwardly resiliently held by said spring.

* * * * *